(12) United States Patent
Yano et al.

(10) Patent No.: US 9,799,806 B2
(45) Date of Patent: Oct. 24, 2017

(54) LIGHT EMITTING DEVICE AND SEALING LAYER FOR THE LIGHT EMITTING DEVICE

(71) Applicant: TOYODA GOSEI CO., LTD., Kiyosu-shi (JP)

(72) Inventors: Yuichi Yano, Kiyosu (JP); Yuhki Ito, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/079,626

(22) Filed: Mar. 24, 2016

(65) Prior Publication Data

US 2016/0284953 A1 Sep. 29, 2016

(30) Foreign Application Priority Data

Mar. 26, 2015 (JP) .................................. 2015-064528

(51) Int. Cl.
 *H01L 33/56* (2010.01)
 *H01L 33/00* (2010.01)
 *H01L 33/54* (2010.01)

(52) U.S. Cl.
 CPC .............. *H01L 33/56* (2013.01); *H01L 33/54* (2013.01)

(58) Field of Classification Search
 CPC .................................. H01L 33/54; H01L 33/56
 USPC ............. 257/100, 773, 98; 438/22; 427/387; 525/479, 478; 524/588; 335/297
 See application file for complete search history.

(56) References Cited

U.S. PATENT DOCUMENTS

| 5,494,979 A * | 2/1996 | Ebbrecht ................ C08G 77/20 522/99 |
| 5,548,038 A * | 8/1996 | Enami ..................... C08L 83/04 525/478 |
| 2006/0105481 A1* | 5/2006 | Boardman ............. C08L 83/04 438/22 |
| 2010/0188179 A1* | 7/2010 | Mitani ...................... B22F 1/02 335/297 |
| 2010/0193961 A1* | 8/2010 | Konishi .................. C08L 63/00 257/773 |
| 2013/0065983 A1* | 3/2013 | Ono ........................ C08L 83/08 522/172 |
| 2015/0034983 A1* | 2/2015 | Takenaka ................ H01L 33/44 257/98 |
| 2015/0158982 A1* | 6/2015 | Saito ........................ C08K 3/36 524/588 |
| 2015/0232699 A1* | 8/2015 | Fish ...................... C09D 183/04 427/387 |

FOREIGN PATENT DOCUMENTS

| JP | 2005-327777 A | 11/2005 |
| JP | 2009-173789 A | 8/2009 |
| JP | 2010-168443 A | 8/2010 |

* cited by examiner

*Primary Examiner* — Mohammed Shamsuzzaman
(74) *Attorney, Agent, or Firm* — McGinn IP Law Group, PLLC (57) ABSTRACT

A emitting device includes: an LED chip mounted on a substrate; and a sealing layer that encloses the LED chip, wherein: the sealing layer is a single layer having a thickness of from 0.1 mm to 1.0 mm and a maximum width of from 6.0 mm to 20 mm; and the sealing layer is composed of a methylsilicone composition and the mole percentage (mol %) X of Si—$CH_3$ in the methylsilicone composition is more than 90 and less than 100.

11 Claims, 7 Drawing Sheets

LIGHT EMITTING DEVICE AND SEALING LAYER FOR THE LIGHT EMITTING DEVICE

CROSS-REFERENCE TO RELATED APPLICATIONS

This application is based upon and claims the benefit of priority from Japanese Patent Application No. 2015-064528, filed on Mar. 26, 2015, the entire contents of which are incorporated herein by reference.

BACKGROUND

1. Field of the Invention

The present invention relates to, in a light emitting device comprising an LED chip, an improvement in a sealing layer that encloses the LED chip.

2. Description of the Related Art

An LED chip to be mounted on a light emitting device is sealed with a sealing layer. The sealing layer is required to have not only transparency of a light emitted from the LED chip but also various characteristics such as light resistance, heat resistance, chemical resistance, and insulating properties.

In a light emitting device that is required to exhibit a particularly high output, for a forming material of the sealing layer, a high light resistance is required as light intensity of the LED chip is increased and a high heat resistance is required as heat generation in the LED chip increases.

As such a forming material of the sealing layer, a silicone composition has been proposed. For example, refer to JP-A-2005-327777, JP-A-2009-173789 and JP-A-2010-168443.

With an increase in the output of the light emitting device, an enlargement in physical dimensions of the light emitting device itself, so-called an increase in size (upsizing) is sometimes required.

As one type of the light emitting device, there is one having a configuration where an LED chip is mounted on a substrate, the LED chip is surrounded with a cup-shaped case part, the inside of the case part is filled with a silicone composition, and thus the LED chip is enclosed with a sealing layer composed of the silicone composition. In the light emitting device having such a configuration, the diameter of the case part is increased with an increase in the size thereof. On the other hand, the thickness (height) of the case part is sometimes restricted and, as a result, the sealing layer that encloses the LED chip is flattened. When repeated thermal histories are applied to such a flat sealing layer, it has been found that, even when the forming material is a silicone composition intrinsically having rubbery properties, there is a concern that cracks are generated therein.

On the other hand, in a versatile light emitting device in which the diameter of the case part is about 2 mm, the phenomenon of crack generation in the sealing layer does not occur and there has not been performed investigations for preventing the crack generation. In other words, any parameters that may cause crack generation in the sealing layer have not been investigated.

SUMMARY

An object of the present invention is to prevent the crack generation by selecting an appropriate combination of the internal space of the case part (i.e., the shape of the sealing layer) and the silicone composition while an increase in the diameter of the case part is attained.

A first aspect of the invention is defined as follows:

A light emitting device includes: an LED chip mounted on a substrate; and a sealing layer that encloses the LED chip, wherein: the sealing layer is a single layer having a thickness of from 0.1 mm to 1.0 mm and a maximum width of from 6.0 mm to 20 mm; and the sealing layer is composed of a methylsilicone composition and the mole percentage (mol %) X of Si—$CH_3$ in the methylsilicone composition is more than 90 and less than 100.

According to the thus configured light emitting device of the first aspect, even in the case of a wide sealing layer having a small aspect ratio, i.e., a flat sealing layer, cracks are hardly generated in the sealing layer by increasing the ratio of the methyl group in the side chains of the methylsilicone composition selected as a foaming material, even when repeated thermal histories are applied.

Herein, in an extremely thin sealing layer having a thickness of less than 0.1 mm, there is a concern that cracks are generated by not only the thermal histories but also mechanical impact. Furthermore, there is a concern that a sealing layer having a thickness of more than 1.0 mm reduces the transparency of a light from the LED chip.

From another point of view, the thickness of the sealing layer can be determined to be from 0.2 mm to 0.8 mm From still another point of view, the thickness of the sealing layer can be determined to be from 0.4 mm to 0.6 mm In a sealing layer having a maximum width of less than 6.0 mm, cracks are hardly generated within the already-mentioned thickness range. Therefore, in the silicone composition that is a forming material of the sealing layer, it is not necessary to select one having a specific characteristic compulsorily. Moreover, since a large-sized sealing layer having a maximum width of more than 20 mm is suitably formed from a plurality of layers, it is not necessary to select a silicone composition suitable as a single layer compulsorily.

From another point of view, the maximum thickness of the sealing layer can be determined to be from 8.0 mm to 16.0 mm From still another point of view, the maximum thickness of the sealing layer can be determined to be from 10.0 mm to 14.0 mm In the methylsilicone composition to be selected in the invention, the mole percentage (mol %) X of Si—$CH_3$ falls within the range of more than 90 and less than 100. That is, by increasing the ratio of the methyl group in the side chains (increasing it to more than 90 mol %), durability against the repeated heat histories is improved and cracks are hardly generated. The reason is considered to be that crosslinking is suppressed by forming almost all the side chains with methyl groups and, as a result, vitrification hardly occurs even when heat histories are applied.

As shown in Comparative Examples to be mentioned later, when X is 90% or less, crack generation is prone to occur in the sealing layer.

A second aspect of the invention is defined as follows:

In the light emitting device defined in the first aspect, the mole percentage (mol %) Y of Si—O is more than 0 and the mole percentage (mol %) Z of SiCH=$CH_2$ is less than 1 in the methylsilicone composition.

According to the light emitting device of the second aspect defined as above, side chains that cause crosslinking are hardly present and, as a result, the vitrification caused by heat histories is more surely suppressed. Moreover, side chains to be targets of oxidation are also hardly present and therefore the crack generation is also more surely suppressed.

A third aspect of the invention is defined as follows:

A sealing layer, in a light emitting device comprising a substrate, an LED chip mounted on the substrate, and a case part that surrounds the LED chip on the substrate and a space defined by the case part has a thickness of from 0.1 mm to 1.0 mm and a maximum width of from 6.0 mm to 20 mm, which sealing layer is filled into the case part to enclose the LED chip, wherein the sealing layer is composed of a methyl silicone composition and the mole percentage (mol %) X of Si—CH$_3$ in the methylsilicone composition is more than 90 and less than 100.

As for the sealing layer of the third aspect defined as above, cracks are not generated therein even when repeated heat histories are applied.

A fourth aspect of the invention is defined as follows:

In the methylsilicone composition to be adopted as a sealing layer defined in the fourth aspect, the mole percentage (mol%) Y of Si—O is more than 0 and the mole percentage (mol %) Z of SiCH=CH$_2$ is less than 1.

According to the sealing layer of the fourth aspect defined as above, the crack generation can be more surely suppressed.

In the light emitting device of the present invention, a specific methylsilicone composition is adopted as a forming material of a sealing layer that encloses an LED chip, and there are clarified ranges (thickness and width) at which the sealing layer formed from the composition does not generate cracks. Thereby, upsizing of the light emitting device and also an increase in the output thereof can be achieved.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Figure 1:
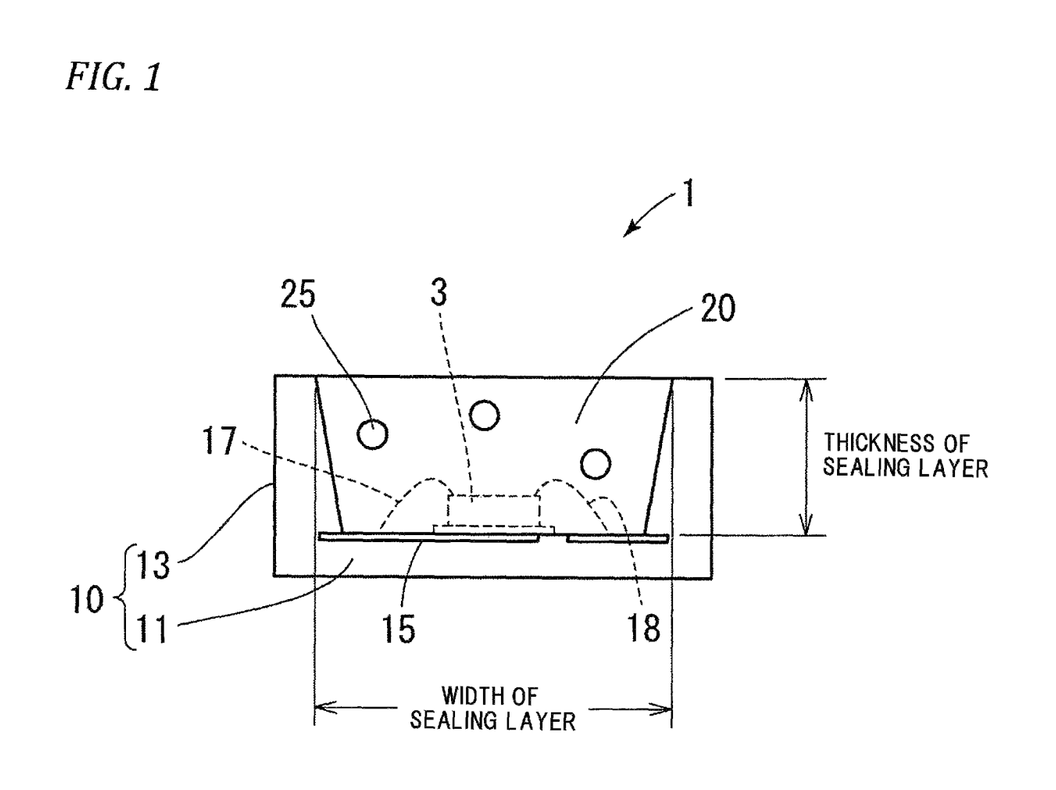
FIG. 1 is a cross-sectional view showing a configuration of a light emitting device 1 of the invention.

FIG. 1 shows a light emitting device 1 according to an embodiment of the present invention.

The light emitting device 1 comprises an LED chip 3, a cup part 10, and a sealing layer 20.

The LED chip 3 is preferably one emitting a light having a wavelength equal to or shorter than blue color. As the light emitting element emitting a light having such a short wavelength, a Group III nitride-based compound semiconductor light emitting element is preferably used. Herein, the Group III nitride-based compound semiconductor is represented by the general formula Al$_x$Ga$_y$In$_{1-x-y}$N (0≤X≤1, 0≤Y≤1, 0≤X+Y≤1), wherein at least a part of the Group III element may be replaced by boron (B), thallium (Tl), or the like and at least a part of nitrogen (N) may be also replaced by phosphorus (P), arsenic (As), antimony (Sb), bismuth (Bi), or the like.

Moreover, the Group III nitride-based compound semiconductor may be one containing any dopant. As n-type impurities, silicon (Si), germanium (Ge), selenium (Se), tellurium (Te), carbon (C), and the like can be used. As p-type impurities, magnesium (Mg), zinc (Zn), beryllium (Be), calcium (Ca), strontium (Sr), barium (Ba), and the like can be used. In this connection, after the p-type impurity is doped, the III nitride-based compound semiconductor can be exposed to electron beam irradiation, plasma irradiation, or heating by an oven but the treatment is not essential.

The Group III nitride-based compound semiconductor layer is formed by an MOCVD (organic metal vapor phase growth) method. It is not necessary to form all the semiconductor layers constituting the element by the MOCVD method and it is possible to use a molecular beam crystal epitaxy method (MBE method), a halide-based vapor phase epitaxy method (HYPE method), a sputtering method, an ion plating method, and/or the like in combination.

As the configuration of the light emitting element, a homo-structure having an MIS junction, a PIN junction, or a pn junction, a hetero-structure, or a double hetero-structure can be employed. It is also possible to adopt a quantum well structure (single quantum well structure or multiple quantum well structure) as a light emitting layer. As such a Group III nitride-based compound semiconductor light emitting element, a face-up type whose main light-receiving light emitting direction (electrode face) is directed to a light-axis direction of the optical device and a flip-chip type whose main light-receiving light emitting direction is directed to a reverse direction of the light axis to utilize a reflected light can be employed.

The cup part 10 comprises a substrate part 11 constituting a bottom part thereof and a case part 13 constituting a side part thereof. As for the cup part 10, the substrate part 11 and the case part 13 are integrally formed by molding using a synthetic resin such as a polyamide. Needless to say, the both parts can be also formed as separate parts using different materials.

A pair of lead frames 15 and 16 are inserted into the substrate part 11 and wires 17 and 18 are suspended between the lead frames 15 and 16 and electrodes of the LED chip 3.

In this example, a face-up type LED chip 3 is used and a sapphire substrate side thereof is fixed to the substrate part 11. In the case of a flip-chip type LED chip, a p-type electrode face thereof is connected to the first lead frame 15 through a conductive bonding layer and an n-type electrode face thereof and the second lead frame 16 are linked with the wire 18.

The shape of the sealing layer 20 is defined by the internal space of the cup part 10. In this example, the width of the opening is 12.0 mm and the height of the case 12 is 0.5 mm.

It is needless to say that the internal space of the cup part 10 can be arbitrarily designed depending on use applications, use conditions, and the like required for the light emitting device but, from the viewpoint of achieving the object of the invention, a maximum width thereof is determined to be from 6.0 mm to 20 mm and a height thereof is determined to be from 0.1 mm to 1.0 mm.

As for the sealing layer 20, a forming material thereof (non-cured state) is filled into the cup part 10 and is cured therein. As a result, in this example, the sealing layer 20 becomes a disk shape having a diameter of 12.0 mm and a thickness of 0.5 mm.

As the forming material of the sealing layer 20, a methylsilicone composition is used. In the methylsilicone composition, the mole percentage (mol %) X of Si—CH₃ is determined to be more than 90 and less than 100. That is, as the ratio (mol %) of the methyl group in the side chains, X is determined to be more than 90 and less than 100. Thereby, it is considered that the crosslinking between the main chains of the silicone composition is suppressed and, as a result, the vitrification caused by heat histories can be suppressed.

Furthermore, in the methylsilicone composition, the mole percentage (mol %) Y of Si—O is determined to be more than 0 and the mole percentage (mol %) Z of SiCH=CH₂ is determined to be less than 1. That is, the oxygen atom and the vinyl group which contribute the crosslinking are excluded from the side chains as far as possible and, as a result, the vitrification caused by heat histories is more surely prevented. By excluding the vinyl group, deterioration by oxidation can be prevented.

The sealing layer may be formed from a single methylsilicone composition or may be formed from a mixture of a plurality of methylsilicone compositions.

In the case where the sealing layer is formed from a plurality of layers, when any layer is formed from a methylsilicone composition, this invention is applied to the layer formed from the methylsilicone composition. The other layer(s) can be arbitrarily selected depending on the use applications and functions of the light emitting device.

The sealing layer 20 may contain a fluorescent substance 25 and further may contain a dispersant for dispersing the fluorescent substance 25. The fluorescent substance 25 may be contained in a dispersed state or may be contained in a precipitated state.

Also, the sealing layer 20 may contain a filler. A content of the filler is not particularly limited. The filler preferably has an excellent heat resistance from the viewpoints of production conditions and performance of the light emitting device.

A material of the filler is preferably less likely to undergo yellowing by heat or light. The sealing material 11 may contain a transparent filler such as silica, a silicone, glass beads, or glass fibers and a white filler such as titanium oxide or potassium titanate. The shape of the filler is not limited and is, for example, crushed one, spherical one, scale-like one, rod-like one, or fibrous one.

Figure 2A:
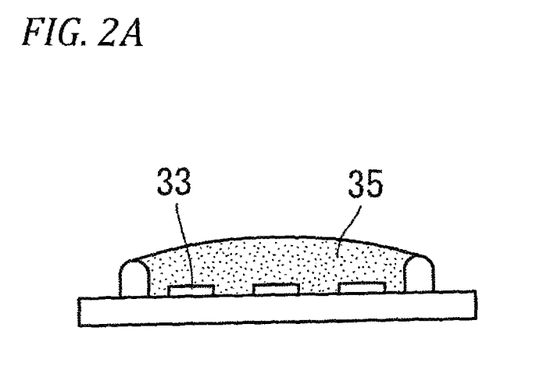
FIGS. 2A to 2C are schematic views showing a principle of crack generation.
Figure 2B:
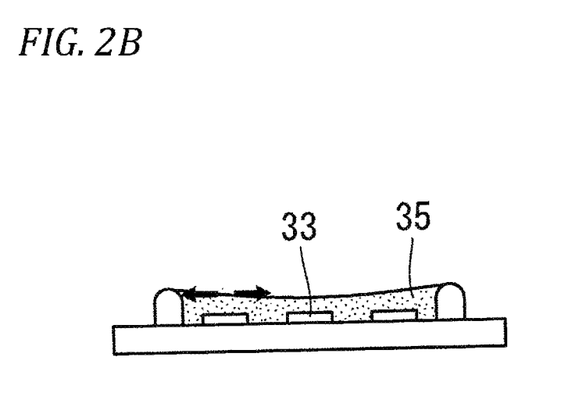
Figure 2C:
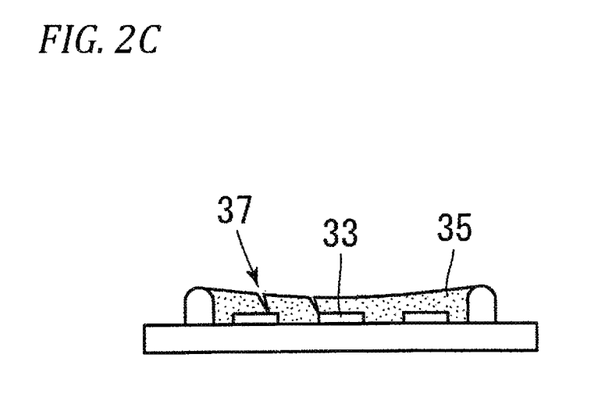

FIGS. 2A to 2C show a mechanism of crack generation.

When a LED chip 33 is turned on, a sealing layer 35 is expanded by heat thereof (FIG. 2A) and, when the LED chip is turned off, the sealing layer 35 is contracted (FIG. 2B). Thus, tensile stress is generated. On this occasion, when the sealing layer 35 does not have a sufficient elongation allowance, a crack 37 is generated by the tensile stress (FIG. 2C). When heat is applied to the sealing layer 35, the forming material is degraded (vitrification, oxidation, etc.) to decrease an elongation percentage thereof and thus the tensile stress cannot be absorbed within the sealing layer 35 to result in cracks.

According to the investigations made by the present inventors, when the shape of the sealing layer 35 falls within ranges of a thickness of from 0.1 mm to 1.0 mm and a maximum width of from 6.0 mm to 20 mm, it has been found that there is a correlation between crack generation time of such a sealing layer and time when the elongation percentage of the forming material of the sealing layer 35 becomes less than +20% (refer to FIG. 3 to be mentioned later).

Incidentally, the crack generation time of the sealing layer was obtained as follows.

Referring to FIG. 1, there was prepared a light emitting device in which the thickness of the sealing layer 20 was 0.5 mm and the inner diameter of upper face of the sealing layer 20 was 12.0 mm. To the light emitting device, a heat history was applied as follows. Crack generation was visually confirmed.

Heat history: 219° C.×75 hours

Figure 3:
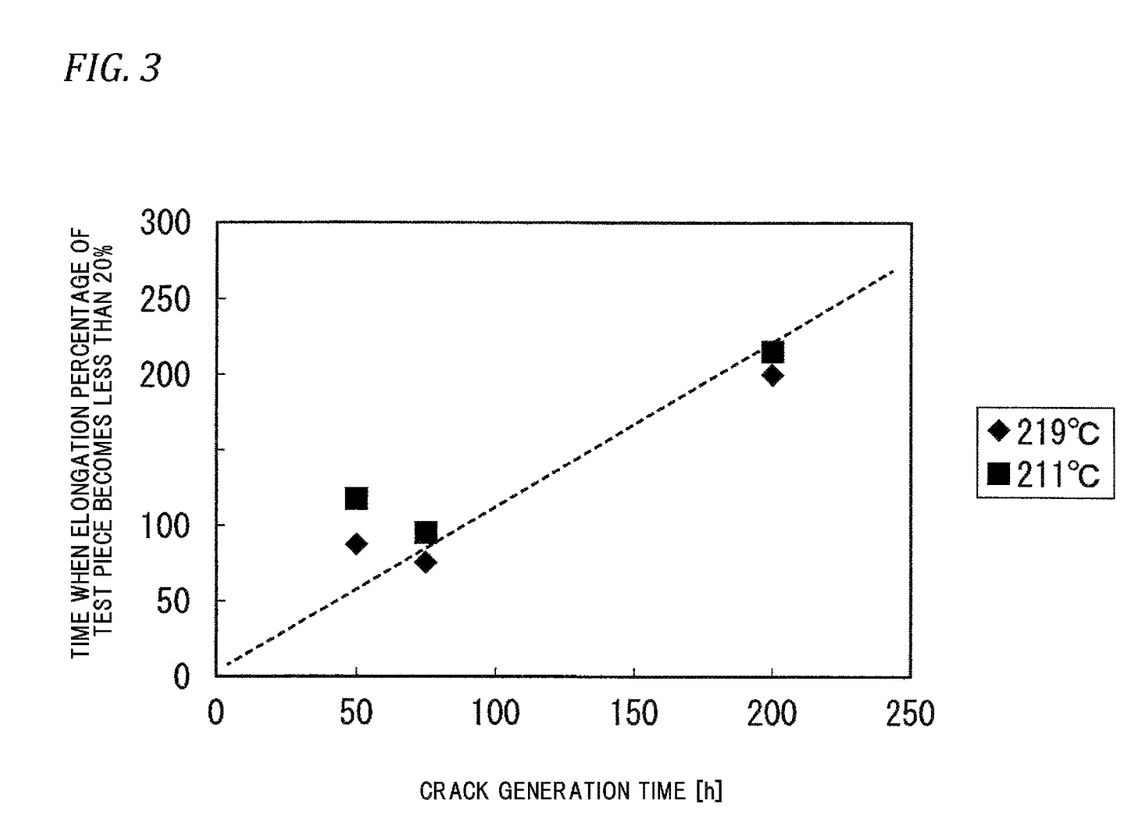
FIG. 3 is a graph showing a relationship between heating time when an elongation percentage of a test piece of a methylsilicone composition becomes less than +20% and crack generation time.

From the results of FIG. 3, it is found that there is a corelation between the time when the elongation percentage of the forming material of the sealing layer 35 becomes less than +20% and the crack generation time of the sealing layer formed from such a forming material.

Accordingly, the following heat resistance test was carried out for commercially available various methylsilicone compositions.

Test piece: JIS K6251 Dumbbell-shaped No. 7 type (2 mm in width×4 mm in length×1 mm in thickness)

Measurement method: The test piece was placed on a polytetrafluoroethylene sheet and an elongation percentage at break was measured by the method in accordance with JIS K615 in a still-standing state in a heat circulation type high-temperature tank.

Table 1 shows mole percentages (mol %) of side chains of methylsilicone compositions that are forming materials of the test pieces of Examples and Comparative Examples.

TABLE 1

| | Polymer composition (IR [mol %]) | | | |
|---|---|---|---|---|
| | Si—CH₃ | Si—H | Si—CH=CH₂ | Si—O |
| Comparative Example 1 | 77.0 | 1.6 | 1.2 | 20.2 |
| Example 1 | 98.0 | 1.3 | 0.7 | 0.1 |
| Comparative Example 2 | 79.1 | 1.4 | 0.9 | 18.6 |
| Example 2 | 99.1 | 0.7 | 0.2 | 0.0 |
| Comparative Example 3 | 85.2 | 1.3 | 0.6 | 12.9 |

The mole percentages were obtained by IR measurement.

Figure 4:
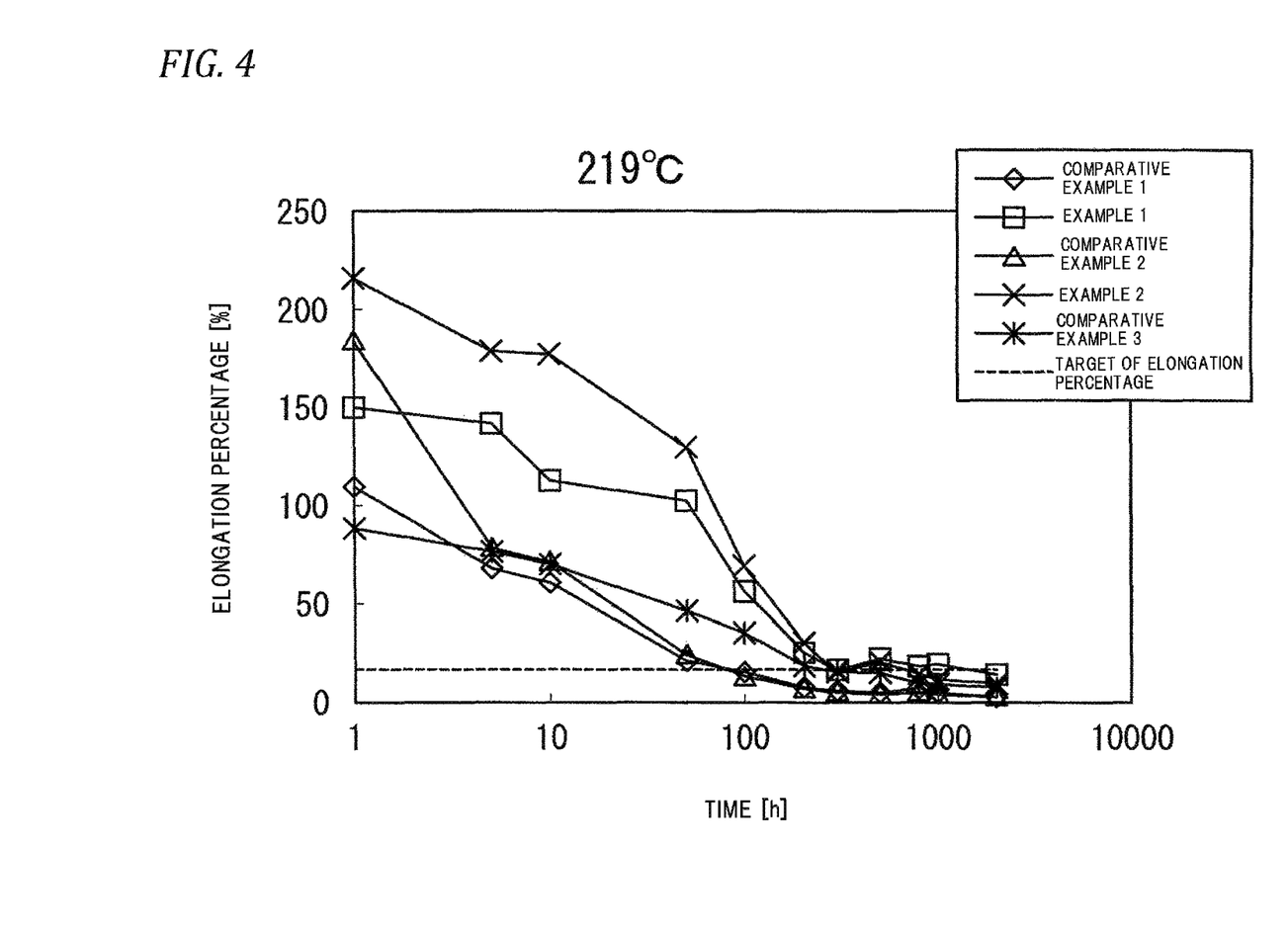
FIG. 4 is a graph showing a relationship between heating time at 219° C. and change in the elongation percentage.
Figure 5:
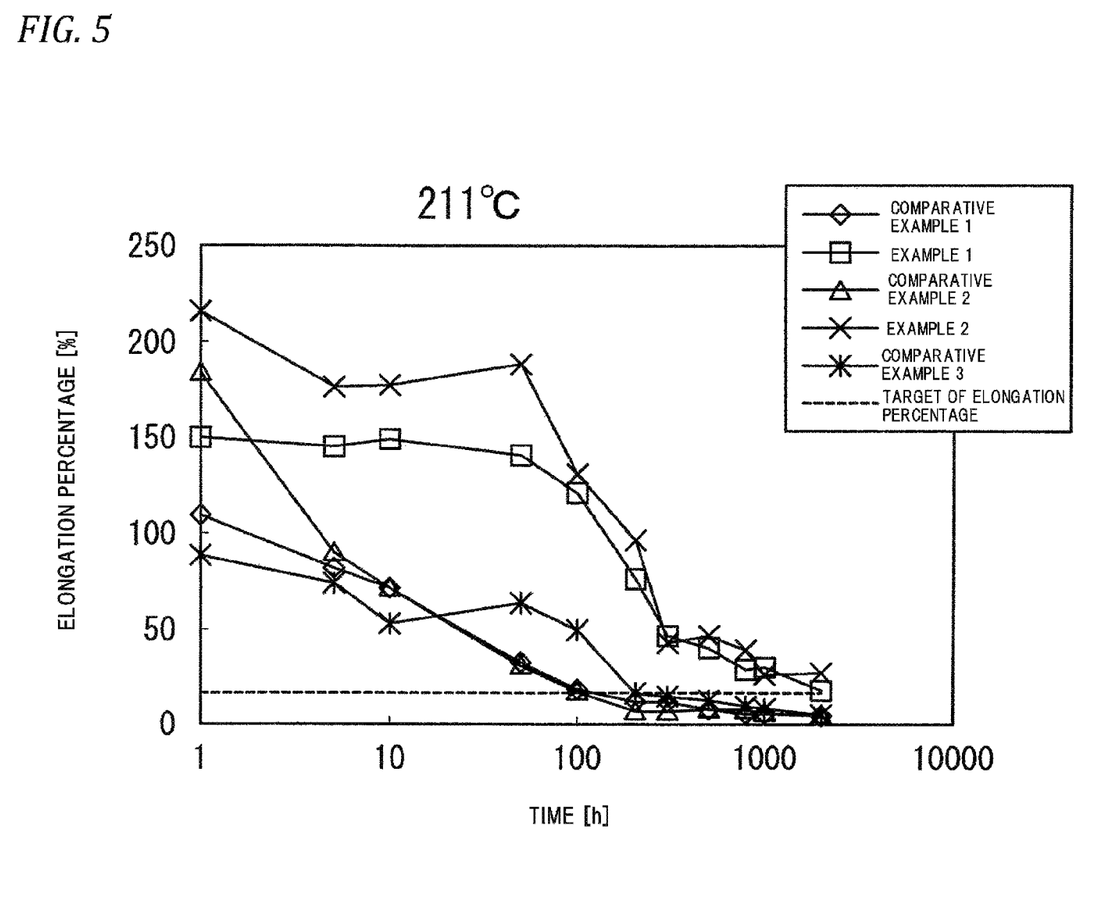
FIG. 5 is a graph showing a relationship between heating time at 210° C. and change in the elongation percentage.

FIG. 4 and FIG. 5 show change of the elongation percentage with time when the test pieces of Examples and Comparative Examples are subjected to heat resistance tests at 219° C. and 210° C.

From the results of FIG. 4 and FIG. 5, it is found that the elongation percentage is maintained for a long period of time in the test pieces of Examples 1 and 2.

When the time (time when the elongation percentage becomes less than +20%) obtained in FIG. 4 was applied to the relation of FIG. 3, the results shown in the following Table 2 were obtained.

TABLE 2

| | Crack generation time [h] 219° C. |
|---|---|
| Comparative Example 1 | 75 |
| Example 1 | No crack generation for 300 h |
| Comparative Example 2 | 50 |
| Example 2 | No crack generation for 300 h |
| Comparative Example 3 | 200 |
| Width of sealing layer | φ = 12 mm |
| Thickness of sealing layer | t = 0.5 mm |

In Examples 1 and 2, it is found that cracks are not generated even when a heat history exceeding 300 hours is applied.

As the light emitting device, there can be adopted various LED lamp packages such as a top-view type LED lamp including a face-up type SMD, a flip-chip type SMD, or the like and also a side-view type, a shell type, and a COB type ones. Silver plating is preferably performed on the lead frame. This is because light extraction efficiency is improved. It is preferable to impart reflectivity onto the surface of a concave portion of a case. For example, as a case composed of a white resin, the surface of the concave portion may be a white reflecting surface. Thereby, the light extraction efficiency can be improved.

The invention is not limited at all to the description of Modes for Carrying Out the Invention and the description of Examples. The invention includes various modifications that can be conceived easily by those skilled in the art, without departing from the description of Claims.

What is claimed is:

1. A light emitting device comprising:
   an LED chip mounted on a substrate;
   a sealing layer that encloses the LED chip; and
   a fluorescent substance formed in the sealing layer in one of a dispersed state and a precipitated state,
   wherein:
      the sealing layer is a single layer having a thickness of from 0.1 mm to 1.0 mm and a maximum width of from 6.0 mm to 20 mm; and
      the sealing layer comprises a methylsilicone composition and the mole percentage (mol %) X of Si—$CH_3$ in the methylsilicone composition is more than 90 and less than 100, and
   wherein the mole percentage (mol %) Y of Si—O is more than 0 and the mole percentage (mol %) Z of SiCH=$CH_2$ is less than 1 in the methylsilicone composition.

2. The light emitting device according to claim 1, further comprising:
   a cup comprising:
      a substrate part constituting a bottom of the cup; and
      a case part connected to the substrate part and constituting a side of the cup.

3. The light emitting device according to claim 2, wherein the case part surrounds the LED chip on the substrate, the sealing layer being formed in the case part to enclose the LED chip.

4. The light emitting device according to claim 2, wherein the substrate part and the case part are integrally formed and comprise a synthetic resin.

5. The light emitting device according to claim 2, further comprising:
   a pair of lead frames formed on the substrate part, the LED chip and the sealing layer being formed on the pair of lead frames.

6. The light emitting device according to claim 5, further comprising:
   a wire formed in the sealing layer and connecting the pair of lead frames to an electrode of the LED chip.

7. The light emitting device according to claim 1, wherein the LED chip emits a light having a wavelength equal to or less than a blue color wavelength.

8. The light emitting device according to claim 1, wherein the LED chip comprises a Group III nitride-based compound semiconductor light emitting element which includes a Group III nitride-based compound semiconductor represented by the general formula $Al_xGa_yIn_{1-x-y}N$ ($0 \leq X \leq 1$, $0 \leq Y \leq 1$, $0 \leq X+Y \leq 1$).

9. The light emitting device according to claim 1, wherein the methylsilicone composition comprises a plurality of methylsilicone compositions.

10. The light emitting device according to claim 1, further comprising:
    a fluorescent substance formed in the sealing layer in one of a dispersed state and a precipitated state.

11. A light emitting device comprising:
    a light-emitting diode (LED) chip mounted on a substrate;
    a sealing layer that encloses the LED chip and comprises a single layer having a thickness in a range of 0.1 mm to 1.0 mm and a width in a range of 6.0 mm to 20 mm, and comprises a methylsilicone composition and a mole percentage (mol %) of Si—$CH_3$ in the methylsilicone composition is in a range of more than 90 and less than 100;
    a cup part comprising:
       a substrate part constituting a bottom of the cup part; and
       a case part constituting a side of the cup part and surrounds the LED chip on the substrate, the sealing layer being formed in the case part to enclose the LED chip;
    a pair of lead frames formed on the substrate part, the LED chip and the sealing layer being formed on the pair of lead frames;
    a wire formed in the sealing layer and connecting the pair of lead frames to an electrode of the LED chip; and
    a fluorescent substance formed in the sealing layer in one of a dispersed state and a precipitated state,
    wherein a mole percentage (mol %) of Si—O is more than 0 and a mole percentage (mol %) of SiCH=$CH_2$ is less than 1 in the methylsilicone composition.

* * * * *